(12) United States Patent
Yokoyama

(10) Patent No.: US 11,444,594 B2
(45) Date of Patent: Sep. 13, 2022

(54) MULTIPLEXER

(71) Applicant: Murata Manufacturing Co., Ltd., Nagaokakyo (JP)

(72) Inventor: Jin Yokoyama, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/108,042

(22) Filed: Dec. 1, 2020

(65) Prior Publication Data
US 2021/0083642 A1 Mar. 18, 2021

Related U.S. Application Data

(63) Continuation of application No. PCT/JP2019/024981, filed on Jun. 24, 2019.

(30) Foreign Application Priority Data

Jun. 29, 2018 (JP) .............................. JP2018-124079

(51) Int. Cl.
H03H 7/46 (2006.01)
H03H 7/01 (2006.01)
(52) U.S. Cl.
CPC ............ H03H 7/46 (2013.01); H03H 7/0138 (2013.01)
(58) Field of Classification Search
CPC .......... H03H 7/46; H03H 7/0138; H03H 7/18; H03H 9/76; H03H 9/72; H04B 1/0057
See application file for complete search history.

(56) References Cited

U.S. PATENT DOCUMENTS

2005/0281210 A1* 12/2005 Makino ................. H03H 7/463
370/275
2009/0002095 A1 1/2009 Terada et al.
(Continued)

FOREIGN PATENT DOCUMENTS

CN 105119611 A 12/2015
JP 2007-266897 A 10/2007
(Continued)

OTHER PUBLICATIONS

Official Communication issued in corresponding Chinese Patent Application No. 201980043301.3, dated Apr. 6, 2021.
(Continued)

Primary Examiner — Stephen E. Jones
Assistant Examiner — Kimberly E Glenn
(74) Attorney, Agent, or Firm — Keating & Bennett, LLP

(57) ABSTRACT

A multiplexer includes an antenna terminal, first to third filters with different passbands, and first and second phase circuits that adjust the phase of a passing signal. The first filter is connected to the antenna terminal. The second filter is connected to the antenna terminal with the first phase circuit provided between the second filter and the antenna terminal. The third filter is connected to a connection node between the first phase circuit and the second filter with the second phase circuit provided between the third filter and the connection node. In the second filter, an unwanted wave is generated in the first passband of the first filter. The first phase circuit adjusts the phase to provide an impedance in an open state in the first passband at the antenna terminal. The second phase circuit adjusts the phase to provide the impedance in a short-circuited state in the first passband at the connection node.

20 Claims, 9 Drawing Sheets

(56) References Cited

U.S. PATENT DOCUMENTS

2012/0274417 A1  11/2012  Kihara et al.
2015/0295596 A1  10/2015  Wloczysiak et al.
2018/0019730 A1   1/2018  Takeuchi et al.

FOREIGN PATENT DOCUMENTS

| JP | 2009-033733 A |   | 2/2009 |
| JP | 4842245 B2 | * | 12/2011 |
| JP | 2013-062556 A |   | 4/2013 |
| JP | 2018-019392 A |   | 2/2018 |

OTHER PUBLICATIONS

Official Communication issued in International Patent Application No. PCT/JP2019/024981, dated Aug. 13, 2019.

* cited by examiner

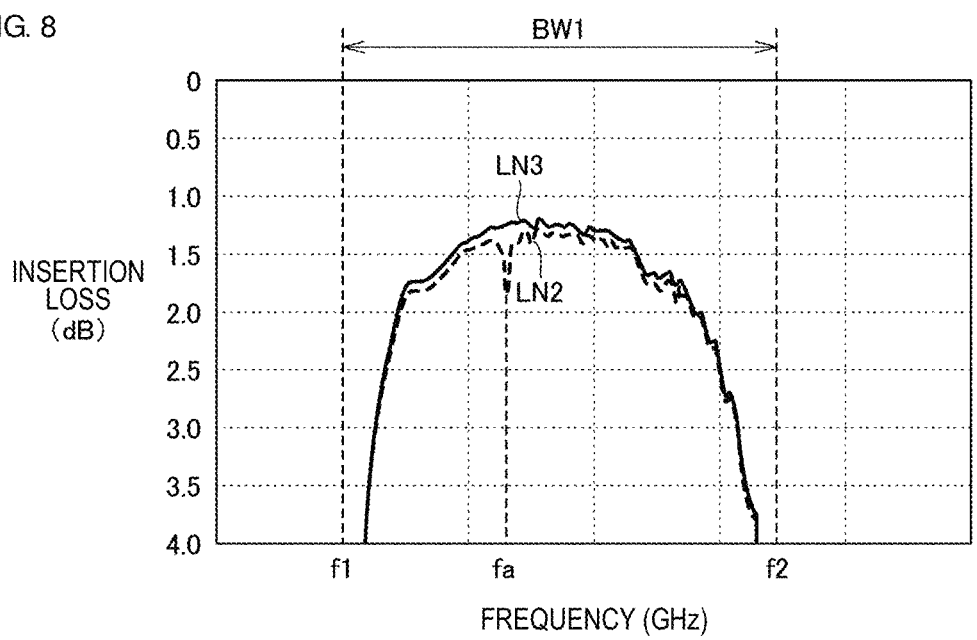

FIG. 10

| RETURN LOSS OF SPURIOUS EMISSION GENERATED BY FILTER 20 | RANGE OF PHASE ADJUSTMENT BY PHASE CIRCUIT 45 |
|---|---|
| 10dB — 30dB | −200° — −155° |
| 5dB — 10dB | −205° — −145° |
| 3dB — 5dB | −210° — −130° |
| 1dB — 3dB | −215° — −105° |

# MULTIPLEXER

CROSS REFERENCE TO RELATED APPLICATIONS

This application claims the benefit of priority to Japanese Patent Application No. 2018-124079 filed on Jun. 29, 2018 and is a Continuation Application of PCT Application No. PCT/JP2019/024981 filed on Jun. 24, 2019. The entire contents of each application are hereby incorporated herein by reference.

BACKGROUND OF THE INVENTION

1. Field of the Invention

The present invention relates to multiplexers, and more particularly relates to multiplexers that each reduce the effects of unwanted waves (spurious emissions) generated by a filter.

2. Description of the Related Art

In recent years, multi-band communication that performs communication using radio waves in a plurality of frequency bands has been promoted in mobile terminals such as cellular phones and smartphones. Such mobile terminals are mounted with a multiplexer for dividing a radio frequency (RF) signal transmitted/received by one antenna into signals in a plurality of frequency bands.

Japanese Unexamined Patent Publication No. 2013-62556 discloses a multiplexer with a plurality of band pass filters having different passbands. In Japanese Unexamined Patent Publication No. 2013-62556, the multiplexer has a configuration in which a duplexer having two filters (F1 and F2) connected in parallel and another filter are connected in parallel to an antenna terminal with a matching circuit interposed therebetween. The matching circuit is adjusted so that, in each filter, the impedance in another filter's passband will be in an open state when viewed from the antenna terminal.

In a communication apparatus where a multiplexer is used, a sudden phase change may occur due to the effects of external noise or the like, which may lead to the generation of an unwanted wave (spurious emission) which is a frequency signal component other than a certain frequency. For example, such a case is that a signal in the passband of a filter B is generated from a filter A. In this case, even if the impedance of each filter is in an open state when viewed from the antenna terminal, the effects of a spurious emission generated by the filter A may be transmitted to the filter B, which may consequently deteriorate the bandpass characteristics of the filter B.

SUMMARY OF THE INVENTION

Preferred embodiments of the present invention reduce or prevent deterioration of bandpass characteristics due to generation of a spurious emission in a multiplexer with a plurality of band pass filters having different passbands.

A multiplexer according to a preferred embodiment of the present invention includes an antenna terminal, first to third filters, and first and second phase circuits that adjust a phase of a passing signal. The first filter has a first passband and is connected to the antenna terminal. The second filter has a second passband and is connected to the antenna terminal with the first phase circuit provided between the second filter and the antenna terminal. In the second filter, an unwanted wave is generated in the first passband. The third filter has a third passband and is connected to a connection node between the first phase circuit and the second filter with the second phase circuit provided between the third filter and the connection node. The first phase circuit adjusts a phase to provide an impedance in an open state in the first passband at the antenna terminal. The second phase circuit adjusts the phase to provide the impedance in a short-circuited state in the first passband at the connection node.

According to the multiplexer according described above, the second filter in which a spurious emission is generated in the first passband is connected to the first filter with the first phase circuit provided therebetween, which is adjusted to provide the impedance in an open state in the first passband, and, at the same time, the second filter is connected to the third filter with the second phase circuit provided therebetween, which is adjusted to provide the impedance in a short-circuited state in the first passband. Therefore, a spurious emission generated by the second filter is not transmitted to the first filter side having the first passband, but is transmitted to the third filter side. Accordingly, the deterioration of bandpass characteristics of the first filter due to the effects of a spurious emission generated by the second filter is able to be reduced or prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 8 is a diagram showing the effects of a spurious emission, generated by the second filter depending on the presence or absence of a phase circuit, on the first filter.

FIG. 10 is a diagram illustrating an example of the adjustment range of the second phase circuit with respect to the level of a spurious emission.

DETAILED DESCRIPTION OF THE PREFERRED EMBODIMENTS

Figure 1:
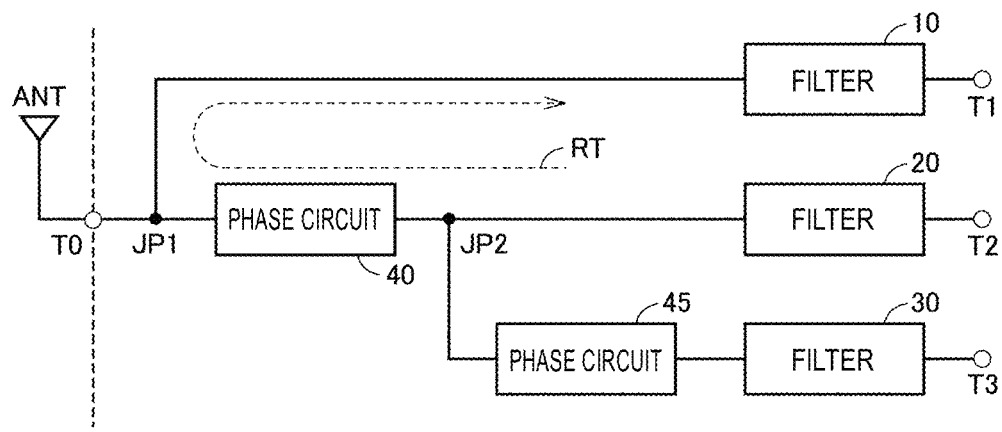
FIG. 1 is a circuit diagram of a multiplexer according to a preferred embodiment of the present invention.

Hereinafter, preferred embodiments of the present invention will be described in detail with reference to the drawings. Note that the same or corresponding portions in the drawings are designated by the same reference numeral, and no description thereof will be repeated.

FIG. 1 is a circuit diagram of a multiplexer 1 according to the present preferred embodiment. Referring to FIG. 1, the multiplexer 1 includes an antenna terminal T0 to which an antenna ANT is connected, filters 10 to 30, phase circuits 40 and 45, and output terminals T1 to T3.

The filters 10 to 30 are band pass filters having different passbands. As the filters 10 to 30, for example, surface acoustic wave (SAW) filters or bulk acoustic wave (BAW) filters may be implemented.

The filter 10 (first filter) has a passband BW1 (first passband), the filter 20 (second filter) has a passband BW2 (second passband), and the filter 30 (third filter) has a passband BW3 (third passband). Although the passbands of these filters may be set arbitrarily, it is set in the example of the present preferred embodiment that the passband BW1 is provided in the lowest frequency band, the passband BW3 is provided in the highest frequency band, and the passband BW2 is provided in the intermediate frequency band.

The filter 10 is connected to the antenna terminal T0 and allows, out of RF signals received by the antenna ANT, signals in the passband BW1 to pass to the output terminal T1. The filter 20 is connected to the antenna terminal T0 with the phase circuit 40 (first phase circuit) provided therebetween. The filter 20 allows, out of RF signals received by the antenna ANT, signals in the passband BW2 to pass to the output terminal T2.

The filter 30 is connected to a connection node JP2 between the phase circuit 40 and the filter 20 with the phase circuit 45 (second phase circuit) provided therebetween. The filter 30 allows, out of RF signals received by the antenna ANT, signals in the passband BW3 to pass to the output terminal T3.

That is, in the multiplexer 1, the filters 20 and 30, which are connected in parallel with the phase circuit 45 provided therebetween, are connected in parallel to the filter 10 with the phase circuit 40 provided therebetween.

The phase circuits 40 and 45 are circuits to adjust the phase of a passing RF signal. In the present preferred embodiment, the phase circuit 40 adjusts the phase of a passing signal to provide the impedance in an open state in the passband (passband BW1) of the filter 10 at a connection node JP1 (i.e., the antenna terminal T0) between the filter 10 and the duplexer. In contrast, the phase circuit 45 adjusts the phase of a passing signal to provide the impedance in a short-circuited state in the passband BW1 at the connection node JP2.

In the present preferred embodiment, the phrase that the impedance is in an "open state" means a high impedance state, which is a state in which the phase is in a vicinity of the left end portion (in a vicinity of −180°) on the Smith chart. In the present preferred embodiment, an "open state" does not necessarily mean that the impedance is infinite. In addition, the phrase that the impedance is in a "short-circuited state" means a low impedance state in which the impedance is close to 0Ω, which is a state in which the phase is in a vicinity of the right end portion (in a vicinity of 0° on the Smith chart.

In the multiplexer 1, each filter is in a short-circuited state with respect to signals with frequencies corresponding to its own passband when viewed from the antenna terminal T0, and is in an open state with respect to signals with frequencies other than the passband. However, in a circuit connected to each output terminal or the filter itself, an unwanted wave (spurious emission) with a frequency other than its own passband may be generated due to the effects of noise or the like. If the frequency of the spurious emission is included in the passband of another filter, this may affect the bandpass characteristics of this other filter.

Figure 2:
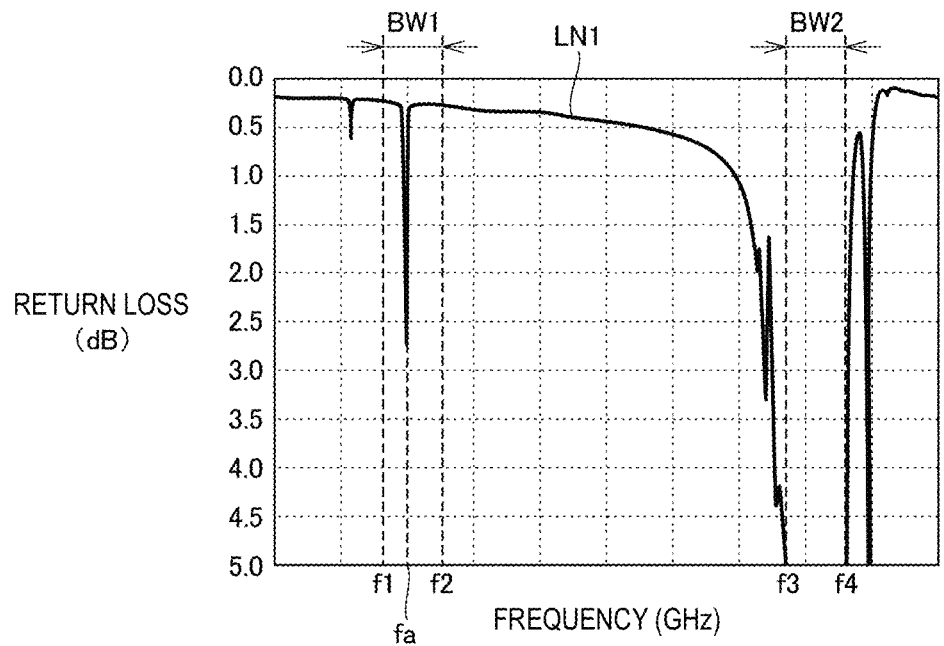
FIG. 2 is a diagram showing the generation of a spurious emission.

FIG. 2 is a diagram showing the generation of a spurious emission. FIG. 2 illustrates an example where, in the filter 20 as illustrated in FIG. 1, a spurious emission with a frequency within the passband BW1 of the filter 10 is generated. More specifically, in FIG. 2, the horizontal axis indicates frequency and the vertical axis indicates the return loss of the filter 20 at the antenna terminal T0.

As shown by line LN1 in FIG. 2, the impedance is low and the return loss is large in the passband BW2 (f3<f<f4) of the filter 20, which means that signals in the passband BW2 are allowed to pass with low loss. In contrast, the return loss should be low in the passband BW1 (f1<f<f2) of the filter 10; however, the return loss is slightly large due to the effects of a spurious emission at frequency fa.

When the spurious emission is generated, if there is no phase circuit 40 illustrated in FIG. 1, the spurious emission generated by the filter 20 is transmitted to the filter 10 through the connection node JP1, as shown by broken line arrow RT in FIG. 1. Since the frequency of the spurious emission is within the passband BW1 of the filter 10, the spurious emission passes through the filter 10 and is output from the output terminal T1, which consequently deteriorates the bandpass characteristics of the filter 10.

In the present preferred embodiment, the phase circuit 40 adjusts the phase to provide the impedance in an open state in the passband BW1 at the antenna terminal T0 (i.e., the connection node JP1), and the phase circuit 45 further adjusts the phase to provide the impedance in a short-circuited state in the passband BW1 at the connection node JP2. Accordingly, a spurious emission generated by the filter 20 is allowed to flow through the phase circuit 45 more easily with a relatively low impedance, without passing through the phase circuit 40 with a relatively high impedance. Therefore, a spurious emission generated by the filter 20 is less likely to be transmitted to the filter 10.

In addition, since the impedance in the passband BW1 of the phase circuit 40 is in an open state, signals in the passband BW1 out of RF signals received by the antenna ANT do not flow to the filters 20 and 30 side but flow to the filter 10. Accordingly, the deterioration of bandpass characteristics of the filter 10 is able to be reduced or prevented.

Figure 3A:
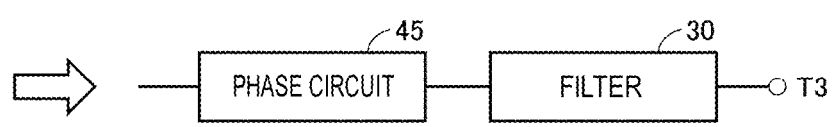
FIGS. 3A and 3B include diagrams showing a phase change applied by a second phase circuit.
Figure 3B:
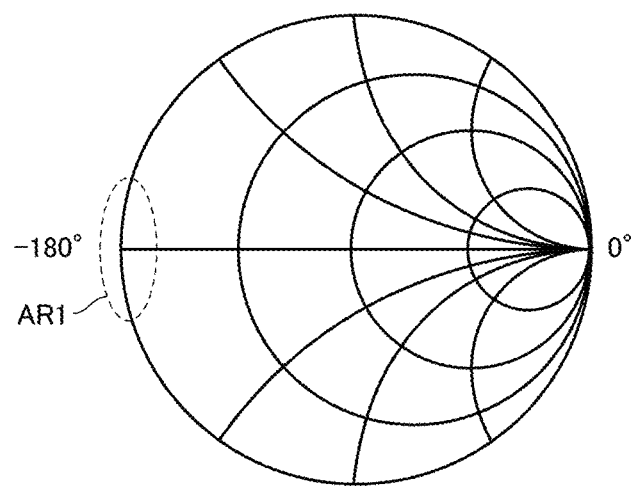

Next, the phase at each point of the multiplexer 1 of the present preferred embodiment will be described with respect to FIGS. 3A to 7. FIGS. 3A and 3B include diagrams showing the phase of a signal in the passband BW1 in the filter 30 after the signal passes through the phase circuit 45. In other words, as illustrated in FIG. 3A, the diagram shows the impedance for a signal in the passband BW1 when the filter 30 side is viewed from the connection node JP2. As described above, the phase circuit 45 is adjusted to provide the impedance with respect to the passband BW1 of the filter 10 in a short-circuited state, the impedance is provided in a vicinity of −180° of the periphery (area AR1 in the diagram) on the Smith chart in FIG. 3B.

Figure 4A:
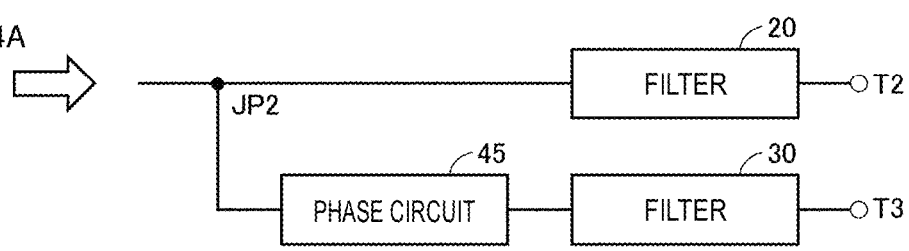
FIGS. 4A and 4B include diagrams showing the phase of a second filter and a third filter at a node between the second filter and the third filter.
Figure 4B:
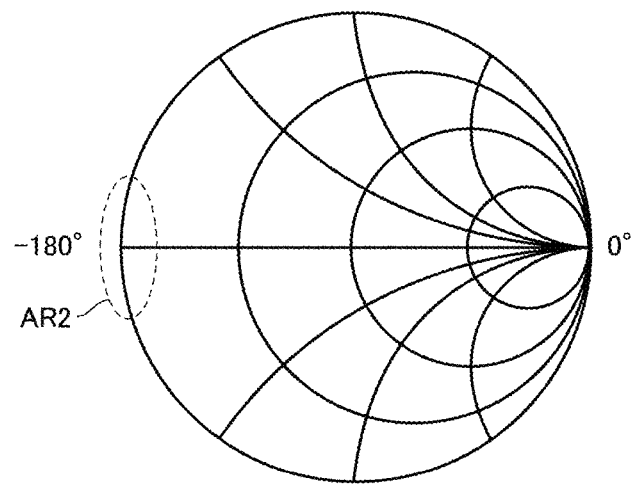

FIGS. 4A and 4B include diagrams showing the phase of a signal in the passband BW1 when, in a state where the filters 20 and 30 are connected, the filters 20 and 30 side is viewed from the connection node JP2 (FIG. 4A). In this case, the connection node JP2 and the filter 20 are directly connected, and the phase circuit 45 adjusts the phase to provide the impedance in the passband BW1 in a short-circuited state. Therefore, when the filters 20 and 30 side is viewed from the connection node JP2, the impedance in the passband BW1 as a whole is also in a short-circuited state, and, as illustrated in FIG. 4B, the impedance is provided in a vicinity of −180° of the periphery (area AR2 in the diagram) on the Smith chart.

FIGS. 5A to 5D include diagrams each illustrating circuitry to provide the phase circuit 45. As the phase circuit 45, any of a delay line 60 (FIG. 5A), a series inductor L1 (FIG. 5B), a parallel capacitor C1 (FIG. 5C), and a combination of the series inductor L1 and the parallel capacitor C1 (FIG. 5D) is applicable.

Figure 5A:
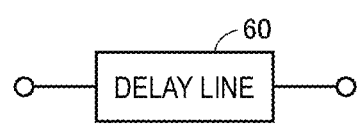
FIGS. 5A to 5D include diagrams each illustrating an example of the second phase circuit.

FIG. 5A is an example where the delay line 60 is applied as the phase circuit 45. On the Smith chart, the delay line moves the impedance clockwise along a circle (constant SWR circle) centered on the center of the Smith chart. Therefore, by adjusting the length of the delay line, the impedance may be set closer to area AR2 in a short-circuited state in FIG. 4B.

Figure 5B:
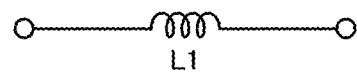

Alternatively, the series inductor L1 may be applied as the phase circuit 45, as illustrated in FIG. 5B. The series inductor moves the impedance clockwise along a circle (constant resistance circle) that contacts the right end portion of the Smith chart. Therefore, by adjusting the inductance of the series inductor L1, the impedance may be set closer to area AR2 in a short-circuited state in FIG. 4B.

Figure 5C:
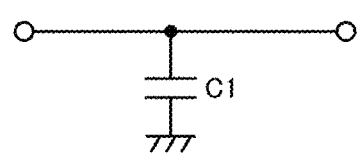

Alternatively, the parallel capacitor C1 may be applied as the phase circuit 45, as illustrated in FIG. 5C. The parallel capacitor moves the impedance clockwise along a circle (constant conductance circle) that contacts the left end portion of the Smith chart. Therefore, by adjusting the capacitance of the parallel capacitor C1, the impedance may be set closer to area AR2 in a short-circuited state in FIG. 4B.

Figure 5D:
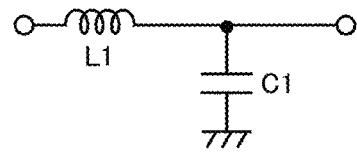

FIG. 5D is an example where the series inductor L1 and the parallel capacitor C1 described above are combined. Depending on the initial impedance state, if the phase is adjusted by only the series inductor or the parallel capacitor, the impedance may not be set sufficiently closer to a short-circuited state, or the element size of the inductor or capacitor included may be increased. By appropriately combining the series inductor and the parallel capacitor, the impedance may be set closer to a short-circuited state while reducing or preventing an increase in the element size. Note that the delay line 60 may be additionally combined with the series inductor L1 and the parallel capacitor C1.

Figure 6A:
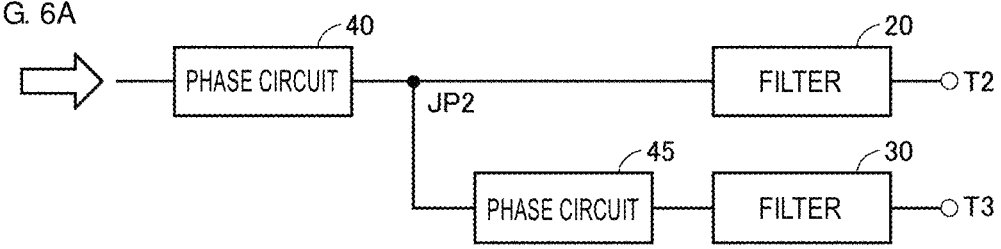
FIGS. 6A and 6B include diagrams showing a phase change applied by a first phase circuit.
Figure 6B:
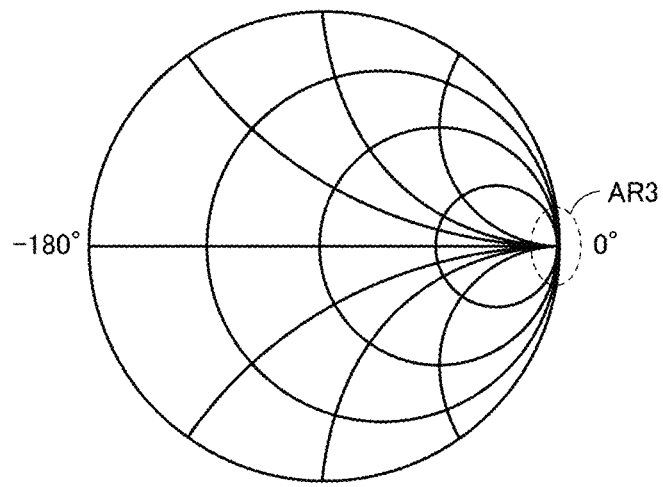

FIGS. 6A and 6B include diagrams showing the phase of a signal in the passband BW1 in the filters 20 and 30 after the signal passes through the phase circuit 40. That is, as illustrated in FIG. 6A, the diagram shows the impedance for a signal in the passband BW1 when the filters 20 and 30 side is viewed from the connection node JP1. As described above, since the phase circuit 40 is adjusted to provide the impedance with respect to the passband BW1 of the filter 10 in an open state, the impedance is provided in a vicinity of −0° of the periphery (area AR3 in the diagram) on the Smith chart in FIG. 6B. Accordingly, a spurious emission with a frequency within the passband BW1, which is generated by the filter 20, is unable to pass through the phase circuit 40, and it flows to the filter 30 side through the phase circuit 45 with low impedance. Therefore, the transmission of a spurious emission generated by the filter 20 to the filter 10 is able to be reduced or prevented.

Figure 7A:
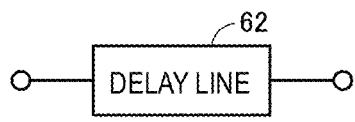
FIGS. 7A to 7C include diagrams each illustrating an example of the first phase circuit.
Figure 7B:
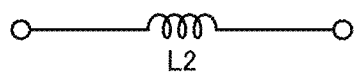
Figure 7C:

FIGS. 7A to 7C include diagrams each illustrating circuitry to provide the phase circuit 40. As the phase circuit 40, any of a delay line 62 (FIG. 7A), a series inductor L2 (FIG. 7B), and a combination of the delay line 62 and the series inductor L2 (FIG. 7C) is applicable. As described above, when the delay line is included, the impedance moves clockwise along a constant SWR circle; and, when the series inductor is included, the impedance moves clockwise along a constant resistance circle. Therefore, in the case where the initial impedance is the capacitive impedance provided in the lower half of the Smith chart, the impedance may be set closer to area AR3 in an open state in FIG. 6B by changing the phase more greatly as compared to the case of setting the impedance in a short-circuited state illustrated in FIGS. 4A and 4B. For example, in the case of including a series inductor for both the phase circuits 40 and 45, the inductance of the series inductor L2 included as the phase circuit 40 is set greater than the inductance of the series inductor L1 included as the phase circuit 45.

FIG. 8 is a diagram showing the effects of a spurious emission, generated by the filter 20 depending on the presence or absence of the phase circuits 40 and 45, on the filter 10. Specifically, FIG. 8 illustrates the result of a simulation comparing the insertion loss of the filter 10 in the case of a multiplexer (comparative example) not including the phase circuits 40 and 45 and the insertion loss of the filter 10 in the case of the multiplexer 1 of the present preferred embodiment. In FIG. 8, broken line LN2 shows the insertion loss in the case of the comparative example, and solid line LN3 shows the insertion loss in the case of the present preferred embodiment.

Referring to FIG. 8, in the case of the comparative example (broken line LN2), a ripple is generated in a portion at frequency fa of a spurious emission, which is in the passband BW1 of the filter 10. In the case where the insertion loss at frequency fa of the spurious emission increases by about 0.5 dB or more as compared to, for example, the peak value, the spurious emission causes a problem since the spurious emission is an unwanted wave. In the case where an increase in insertion loss is less than about 0.5 dB compared to the peak value, substantially no unwanted wave is generated. That is, it is clear in the comparative example that a spurious emission generated by the filter 20 acts as an unwanted wave to affect the bandpass characteristics of the filter 10.

In contrast, in the case of the multiplexer 1 of the present preferred embodiment (solid line LN3), an increase in insertion loss at frequency fa is reduced or prevented, and the effects of a spurious emission from the filter 20 are reduced.

Figure 9:
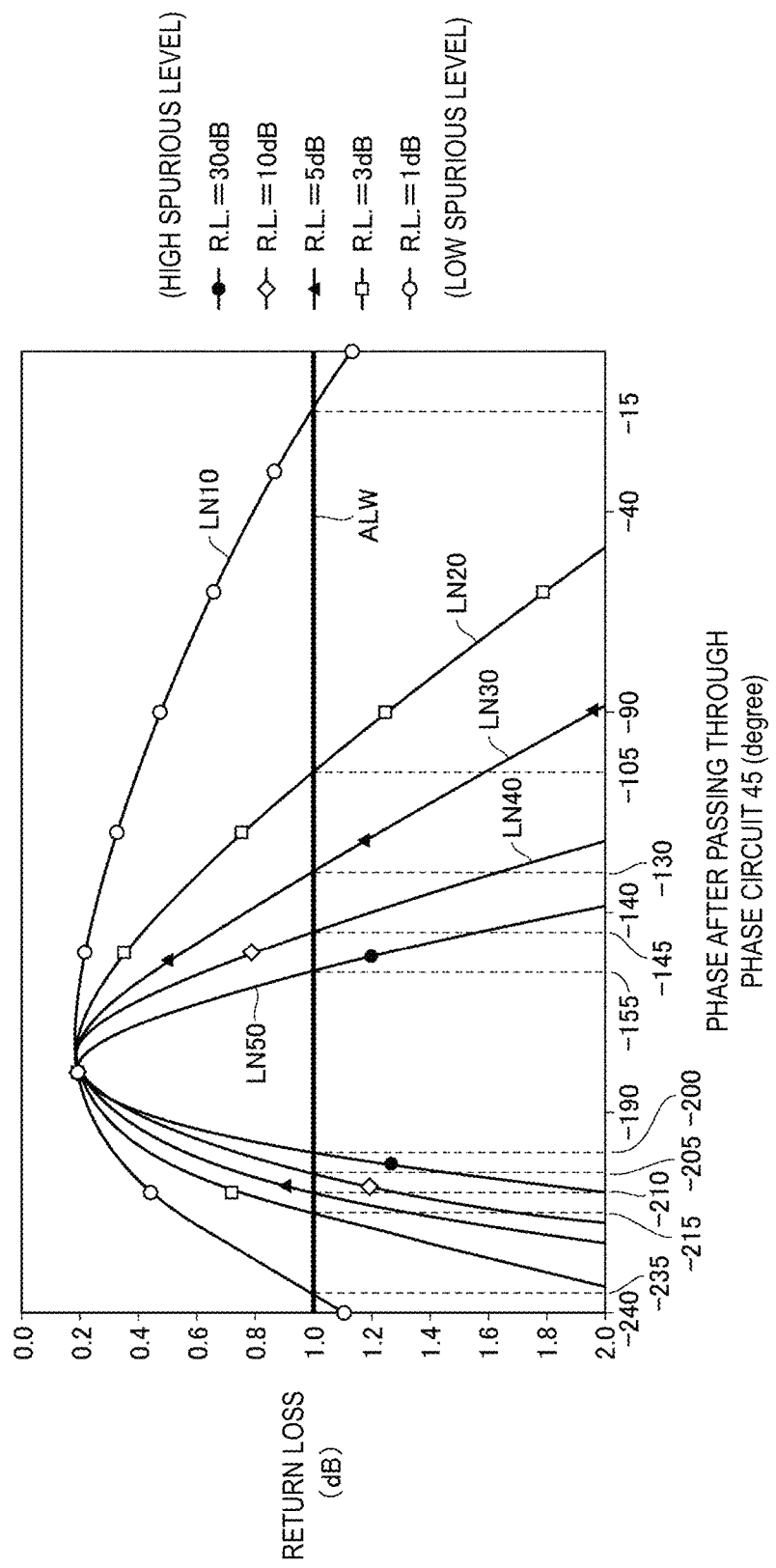
FIG. 9 is a diagram showing the relation between the level of a spurious emission generated by the second filter and the adjustment range of the second phase circuit.

FIG. 9 is a diagram showing the relation between the level of a spurious emission generated by the filter 20 and the adjustment range of the phase circuit 45. In FIG. 9, the horizontal axis indicates the phase of a signal after the signal passes through the phase circuit 45, and the vertical axis indicates the return loss of the filters 20 and 30 when the filters 20 and 30 side is viewed from the connection node JP1. Lines LN10 to LN50 shows the case where the return loss of a spurious emission (ripple) generated by the filter 20 is about 1 dB, about 3 dB, about 5 dB, about 10 dB, and about 30 dB, respectively. The greater the decibel value of the return loss, the higher the level of the spurious emission.

In FIG. 9, the tolerance of the return loss is about 1 dB (line ALW), and a state in which the return loss is less than the tolerance (that is, above line ALW in FIG. 9) is a state in which the effects of a spurious emission on the filter 10 are reduced.

For example, in the case where the return loss of a spurious emission is as small as about 1 dB (line LN10), if the phase is adjusted within the range of greater than or equal to about −235° and less than about −15° by the phase circuit 45, the effects of a spurious emission generated by the filter 20 on the filter 10 may be reduced to an acceptable range.

In the case where the return loss of a spurious emission is as large as about 30 dB (line LN50), in order to reduce the effects of the spurious emission to an acceptable range, the phase is adjusted to a narrower range of greater than or equal to about −200° and less than about −155° by the phase circuit 45.

That is, the greater the level of a spurious emission generated by the filter 20, the narrower the range of phase adjustment to be applied by the phase circuit 45. When viewed in the range of greater than or equal to about −180° and less than about 0°, as the level of a spurious emission increases, the phase is more greatly adjusted in order to reduce the effects of the spurious emission to an acceptable range.

FIG. 10 is a diagram illustrating an example of the adjustment range of the phase circuit 45 with respect to the level of a spurious emission. In the example of FIG. 10, the adjustment range is determined based on the simulation result illustrated in FIG. 9.

Referring to FIG. 10, in the case where the return loss of a spurious emission generated by the filter 20 is greater than or equal to about 10 dB and less than about 30 dB (between line LN50 and line LN40 in FIG. 9), the phase circuit 45 may reduce the effects of the spurious emission on the filter 10 to an acceptable range by adjusting the phase to be within the range of greater than or equal to about −200° and less than about −155° by the phase circuit 45.

In the case where the return loss of a spurious emission is greater than or equal to about 5 dB and less than about 10 dB (between line LN40 and line LN30 in FIG. 9), the range of phase adjustment by the phase circuit 45 is greater than or equal to about −205° and less than about −145°. In the case where the return loss of a spurious emission is greater than or equal to about 3 dB and less than about 5 dB (between line LN30 and line LN20 in FIG. 9), the range of phase adjustment by the phase circuit 45 is greater than or equal to about −210° and less than about −130°. In the case where the return loss of a spurious emission is greater than or equal to about 1 dB and less than about 3 dB (between line LN20 and line LN10 in FIG. 9), the range of phase adjustment by the phase circuit 45 is greater than or equal to about −215° and less than about −105°.

As described above, the effects of a spurious emission generated by the filter 20 on the filter 10 may be reduced by appropriately adjusting the phase of the phase circuit 45 according to the level of the spurious emission generated by the filter 20.

Figure 11:
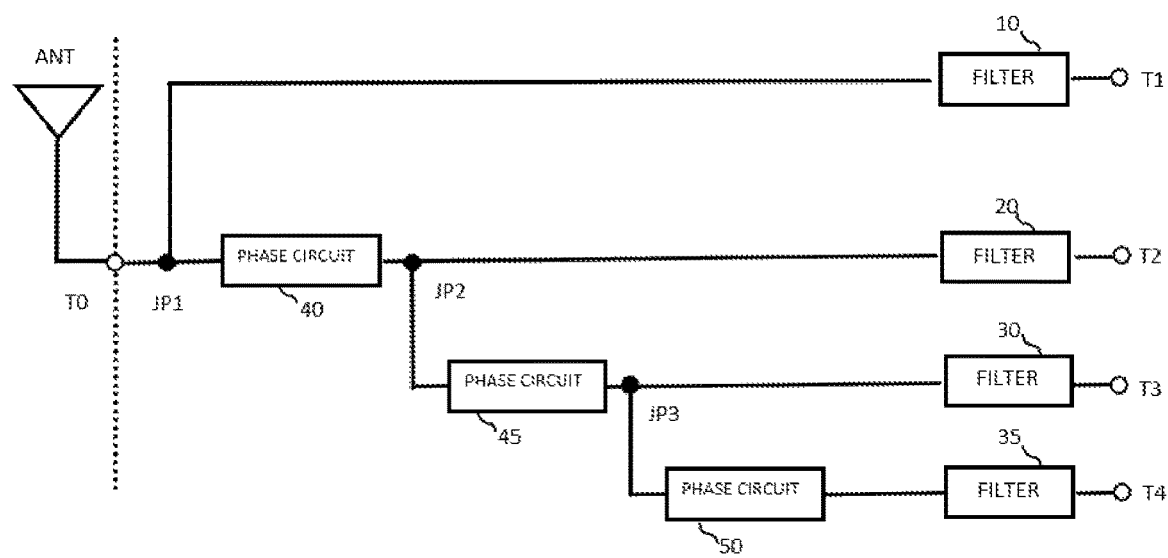
FIG. 11 is a circuit diagram of a multiplexer according to a preferred embodiment of the present invention.

Although an example in the case of a multiplexer (triplexer) including three filters has been described in the above-described preferred embodiment, as illustrated in FIG. 11, even in a multiplexer with four or more filters 10, 20, 30, 35, by providing a phase circuit 40, 45, 50 in accordance with a filter where a spurious emission is generated, the effects on another filter including the frequency of the spurious emission may be reduced.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
   an antenna terminal;
   a first filter having a first passband;
   a second filter having a second passband;
   a third filter having a third passband;
   a first phase circuit; and
   a second phase circuit; wherein
   the first passband, the second passband, and the third passband are different from each other;
   the second filter is connected to the antenna terminal with the first phase circuit provided between the second filter and the antenna terminal;
   the third filter is connected to a connection node between the first phase circuit and the second filter with the second phase circuit provided between the third filter and the connection node;
   the first phase circuit adjusts a phase to provide an impedance in an open state in the first passband at the antenna terminal;
   the second phase circuit adjusts the phase to provide the impedance in a short-circuited state in the first passband at the connection node; and
   the second phase circuit includes at least one of a delay line and an inductor connected between the connection node and the third filter, and a capacitor connected between the connection node and a ground potential.

2. The multiplexer according to claim 1, wherein the second filter generates an unwanted wave in the first passband and the third filter does not generate any unwanted wave in the first passband.

3. The multiplexer according to claim 1, wherein the first phase circuit includes any of a delay line, an inductor, and a delay line and an inductor that are connected in series, which is or are connected between the antenna terminal and the second filter.

4. The multiplexer according to claim 1, wherein, as an unwanted wave in the first passband that is generated by the second filter becomes greater, a range of phase adjustment by the second phase circuit is set to be narrower.

5. The multiplexer according to claim 1, wherein:
   the second phase circuit sets the range of phase adjustment to be greater than or equal to about −200° and less than about −155° in response to a return loss of an unwanted wave in the first passband that is generated by the second filter being greater than or equal to about 10 dB and less than about 30 dB;
   the second phase circuit sets the range of phase adjustment to be greater than or equal to about −205° and less than about −145° in response to the return loss being greater than or equal to about 5 dB and less than about 10 dB;
   the second phase circuit sets the range of phase adjustment to be greater than or equal to about −210° and less than about −130° in response to the return loss being greater than or equal to about 3 dB and less than about 5 dB; and
   the second phase circuit sets the range of phase adjustment to be greater than or equal to about −215° and less than about −105° in response to the return loss being greater than or equal to about 1 dB and less than about 3 dB.

6. The multiplexer according to claim 1, wherein:
   a frequency band of the first passband is lower than a frequency band of the second passband; and
   the frequency band of the second passband is lower than a frequency band of the third passband.

7. The multiplexer according to claim 1, wherein the second filter and the third filter are connected in parallel with the second phase circuit.

8. The multiplexer according to claim 1, wherein the second filter and the third filter are connected in parallel with the first filter.

9. The multiplexer according to claim 1, wherein each of the first filter, the second filter, and the third filter is a surface acoustic wave filter or a bulk acoustic wave filter.

10. The multiplexer according to claim 1, wherein:
the open state is a high impedance state; and
the short-circuited state is a low impedance state.

11. A multiplexer comprising:
an antenna terminal;
a first filter having a first passband;
a second filter having a second passband;
a third filter having a third passband;
a fourth filter having a fourth passband;
a first phase circuit;
a second phase circuit; and
a third phase circuit; wherein
the first passband, the second passband, and the third passband are different from each other;
the second filter is connected to the antenna terminal with the first phase circuit provided between the second filter and the antenna terminal;
the third filter is connected to a connection node between the first phase circuit and the second filter with the second phase circuit provided between the third filter and the connection node;
the first phase circuit adjusts a phase to provide an impedance in an open state in the first passband at the antenna terminal;
the second phase circuit adjusts the phase to provide the impedance in a short-circuited state in the first passband at the connection node; and
the fourth filter is connected to a second connection node between the second phase circuit and the third filter with the third phase circuit provided between the fourth filter and the second connection node.

12. The multiplexer according to claim 11, wherein
the second filter generates an insertion loss of greater than about 0.5 dB in the first passband; and
the third filter generates an insertion loss of less than about 0.5 dB in the first passband.

13. A multiplexer comprising:
an antenna terminal;
a first filter having a first passband;
a second filter having a second passband;
a third filter having a third passband;
a first phase circuit; and
a second phase circuit; wherein
the first passband, the second passband, and the third passband are different from each other;
a frequency band of the first passband is lower than a frequency band of the second passband;
the frequency band of the second passband is lower than a frequency band of the third passband;
the second filter is connected to the antenna terminal with the first phase circuit provided between the second filter and the antenna terminal;
the third filter is connected to a connection node between the first phase circuit and the second filter with the second phase circuit provided between the third filter and the connection node;
the first phase circuit adjusts a phase to provide an impedance in an open state in the first passband at the antenna terminal; and
the second phase circuit adjusts the phase to provide the impedance in a short-circuited state in the first passband at the connection node.

14. The multiplexer according to claim 13, wherein the first phase circuit includes any of a delay line, an inductor, and a delay line and an inductor that are connected in series, which is or are connected between the antenna terminal and the second filter.

15. The multiplexer according to claim 13, wherein, as an unwanted wave in the first passband that is generated by the second filter becomes greater, a range of phase adjustment by the second phase circuit is set to be narrower.

16. The multiplexer according to claim 13, wherein:
the second phase circuit sets the range of phase adjustment to be greater than or equal to about −200° and less than about −155° in response to a return loss of an unwanted wave in the first passband that is generated by the second filter being greater than or equal to about 10 dB and less than about 30 dB;
the second phase circuit sets the range of phase adjustment to be greater than or equal to about −205° and less than about −145° in response to the return loss being greater than or equal to about 5 dB and less than about 10 dB;
the second phase circuit sets the range of phase adjustment to be greater than or equal to about −210° and less than about −130° in response to the return loss being greater than or equal to about 3 dB and less than about 5 dB; and
the second phase circuit sets the range of phase adjustment to be greater than or equal to about −215° and less than about −105° in response to the return loss being greater than or equal to about 1 dB and less than about 3 dB.

17. The multiplexer according to claim 13, wherein the second filter and the third filter are connected in parallel with the second phase circuit.

18. The multiplexer according to claim 13, wherein the second filter and the third filter are connected in parallel with the first filter.

19. The multiplexer according to claim 13, wherein each of the first filter, the second filter, and the third filter is a surface acoustic wave filter or a bulk acoustic wave filter.

20. The multiplexer according to claim 13, wherein:
the open state is a high impedance state; and
the short-circuited state is a low impedance state.

* * * * *